(12) United States Patent
Tsai et al.

(10) Patent No.: US 10,347,640 B1
(45) Date of Patent: Jul. 9, 2019

(54) METHOD FOR FORMING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Ya-Ying Tsai, Tainan (TW); Keng-Jen Lin, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/051,508

(22) Filed: Aug. 1, 2018

(30) Foreign Application Priority Data

Jul. 12, 2018 (CN) .......................... 2018 1 0763024

(51) Int. Cl.
*H01L 27/108* (2006.01)
*H01L 21/762* (2006.01)
*H01L 29/06* (2006.01)

(52) U.S. Cl.
CPC .... *H01L 27/1085* (2013.01); *H01L 21/76232* (2013.01); *H01L 27/10805* (2013.01); *H01L 29/0649* (2013.01)

(58) Field of Classification Search
CPC ...................................................... H01L 27/108
See application file for complete search history.

(56) References Cited

U.S. PATENT DOCUMENTS

2017/0012098 A1   1/2017   Park

*Primary Examiner* — Marvin Payen
(74) *Attorney, Agent, or Firm* — Winston Hsu

(57) ABSTRACT

The invention provides a manufacturing method of a semiconductor device. First, a substrate is provided. A first recess and a second recess are formed in the substrate, a width of the first recess is smaller than a width of the second recess. Then, a first spin-on dielectric (SOD) layer is formed to fill the first recess and partially fill in the second recess, and then a first processing step is performed to transfer the first SOD layer into a first silicon oxide layer, a silicon nitride layer is subsequently formed on the first silicon oxide layer in the second recess, and then a second spin-on dielectric (SOD) layer is formed on the silicon nitride layer in the second recess, and a second processing step is performed to transfer the second SOD layer into a second silicon oxide layer.

15 Claims, 4 Drawing Sheets

US 10,347,640 B1

METHOD FOR FORMING SEMICONDUCTOR DEVICE

BACKGROUND OF THE INVENTION

1. Field of the Invention

The present invention relates to semiconductor fabrication field, and more particularly to a method of fabricating a semiconductor device comprising a silicon oxide layer converted by a spin-on dielectric (SOD) layer.

2. Description of the Prior Art

Dynamic random access memory (DRAM) is a kind of volatile memory, which is constituted by a plurality of memory cells. Each memory cell is mainly constituted by one transistor and one capacitor controlled by a transistor, and each memory cell are electrically connected by the word line (WL) and bit line (BL).

In order to improve the operation speed of the dynamic random access memory, and to meet consumer demand for miniaturization of electronic devices, the channel length of the transistor of the dynamic random access memory needs to be shorten. However, others issues may be happened, such as short channel effects, the on current loss and other problems.

Accordingly, in order to overcome the above problems, in recent years, the vertical transistor structure replaces the horizontal transistor structure, for example, the vertical transistor structure is formed in a deep trench in the substrate. In this way, the operating speed and the volume can be improved, and the short channel effect and other issues can also be prevented. However, the general vertical transistor used in structural design still needs to be improved, it is one of the goals researched in this field.

SUMMARY OF THE INVENTION

The invention provides a manufacturing method of a semiconductor device. First, a substrate is provided. A first recess and a second recess are formed in the substrate, a width of the first recess is smaller than a width of the second recess. Then, a first spin-on dielectric (SOD) layer is formed to fill the first recess and partially fill in the second recess, and then a first processing step is performed to transfer the first SOD layer into a first silicon oxide layer, a silicon nitride layer is subsequently formed on the first silicon oxide layer in the second recess, and then a second spin-on dielectric (SOD) layer is formed on the silicon nitride layer in the second recess, and a second processing step is performed to transfer the second SOD layer into a second silicon oxide layer.

The invention is characterized in that since the different sizes shallow trench isolations needs to be formed in the cell region and the peripheral region, the silicon oxide layer is formed by deposition or the like, and the void is easily formed in the high aspect ratio recess. In order to avoid the above issue, the present invention fills a fluid material (for example, perhydropolysilazane, PHPS) in the high aspect ratio recess to replace forming the silicon oxide layer by deposition method, and then converting the fluid material into an insulating oxidation layer (such as silicon oxide layer) by steam heating or the like. Thus, the recesses can be effectively filled to avoid voids and further improve the quality of the overall semiconductor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic cross-sectional views showing a fabrication of a semiconductor device in a first preferred embodiment of the present invention, wherein:

FIG. 1 is a schematic view showing the formation of two recesses in a substrate;

FIG. 2 is a schematic view showing the formation of a silicon oxide layer in each recess;

FIG. 3 is a schematic view showing the formation of an amorphous silicon layer and a spin-on dielectric (SOD) layer;

FIG. 4 is a schematic view showing the conversion of a spin-on dielectric layer into a silicon oxide layer;

FIG. 5 is a schematic view showing the formation of a silicon nitride layer and another silicon oxide layer;

FIG. 6 is a schematic view showing the formation of another spin-on dielectric layer;

FIG. 7 is a schematic view showing the conversion of another spin-on dielectric layer into a silicon oxide layer; and FIG. 8 is a schematic diagram showing the third processing step.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
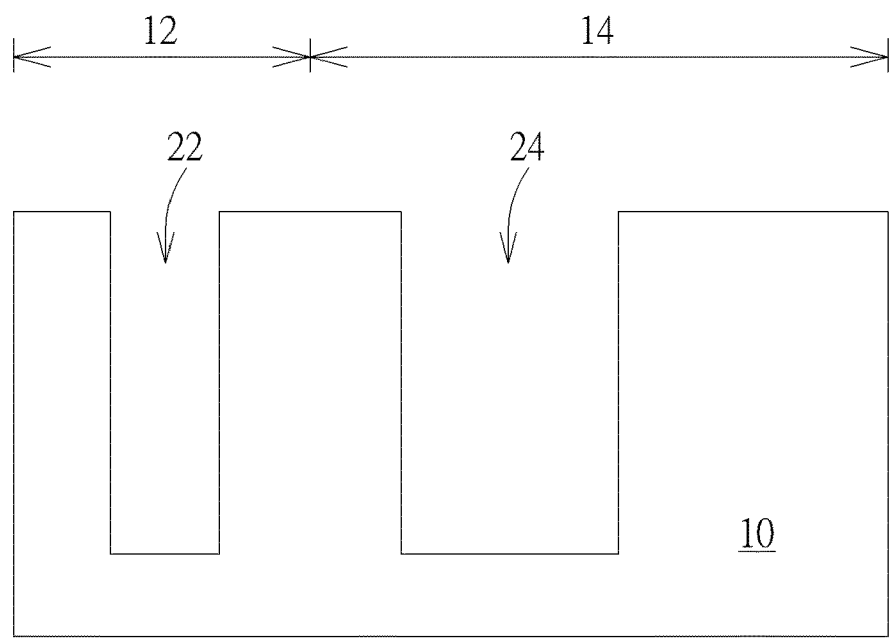

FIG. 1 to FIG. 8 are schematic cross-sectional views showing the fabrication of a semiconductor device in a first preferred embodiment of the present invention. As shown in FIG. 1, a substrate 10 is first provided, a cell region 12 and a peripheral region 14 are defined on the substrate 10. The cell region 12 and the peripheral region 14 referred to herein are, for example, a cell region and a peripheral region in a dynamic random access memory (DRAM). Generally, in the subsequent steps, different sizes elements are formed in the cell region 12 and in the peripheral region 14 respectively. For example, a plurality of densely arranged word lines or bit lines may be formed in the cell region 12, so that the size of the shallow trench isolation for isolating the elements is relatively small. On the other hand, the peripheral region 14 also includes the shallow trench isolation, but the width of the shallow trench isolation in the peripheral region 14 is typically greater than the width of the shallow trench isolation within the cell region 12. In other words, according to actual requirements, the shallow trench isolations with different widths are formed in the cell region 12 and the peripheral region 14 respectively. Taking the embodiment as an example, the substrate 10 includes two recesses: the first recess 22 is located in the cell region 12, and the second recess 24 is located in the peripheral region 14. The width of the first recess 22 is smaller than the width of the second recess 24, preferably, the width of the first recess 22 is between 15-55 nm, and the width of the second recess 24 is between 75-500 nm, but the invention is not limited thereto.

Figure 2:
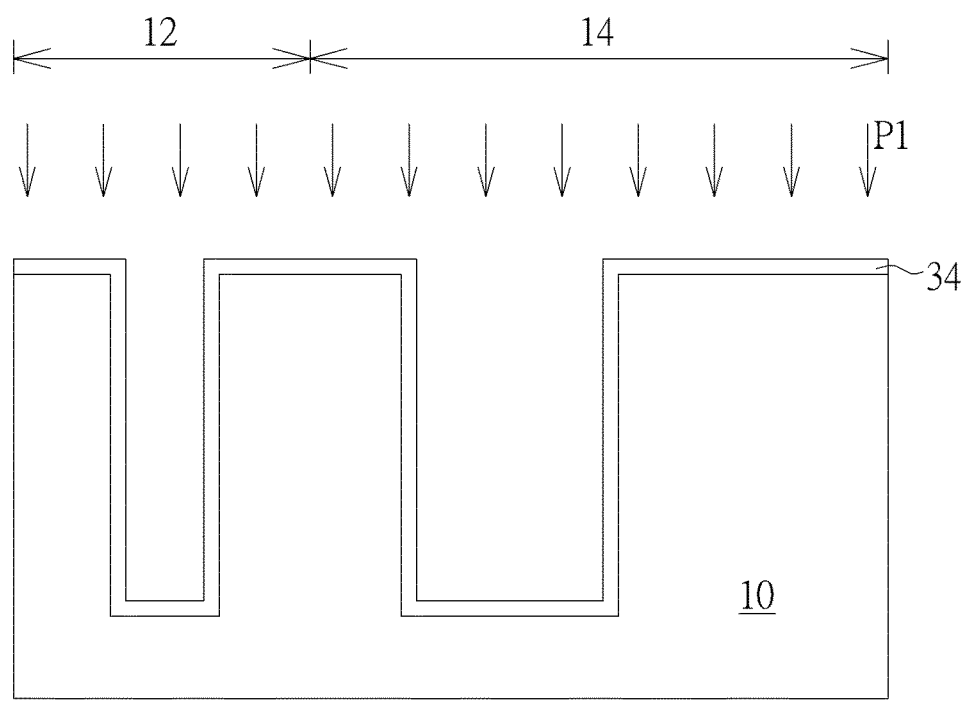

Next, as shown in FIG. 2, a silicon oxide layer 34 is formed in the first recess 22 and in the second recess 24, the silicon oxide layer 34 is preferably generated by a in situ steam generated (ISSG) step P1, but the invention is not limited thereto. The recess oxide layer 34 formed here has the function of protecting the substrate 10, and furthermore makes the surface of the substrate flatter, facilitating the formation of subsequent material layers.

Figure 3:
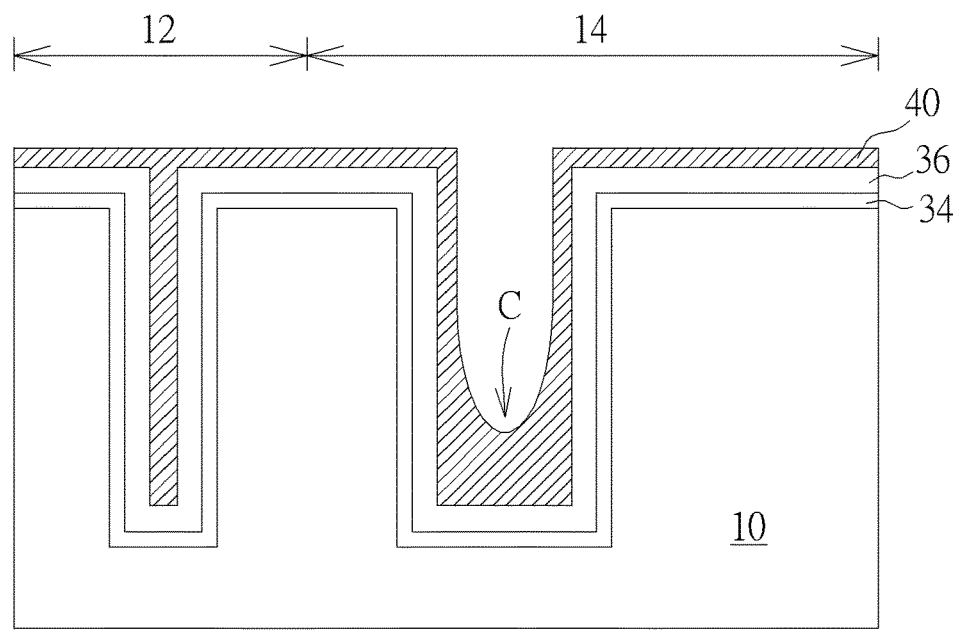

Next, as shown in FIG. 3, an amorphous silicon layer 36 and a spin-on dielectric (SOD) layer 40 are formed in the first recess 22 and in the second recess 24, the amorphous silicon layer 36 may be produced by physical vapor deposition (PVD), chemical vapor deposition (CVD), atomic layer deposition (ALD), and the like. The thickness of the amorphous silicon layer 36 is preferably between 20 and 100 angstroms, but is not limited thereto. The spin-on dielectric layer 40 fills the first recess 22, but since the width of the second recess 24 is larger, so the spin-on dielectric layer 40 does not fill the second recess 24. That is, the spin-on dielectric layer 40 in the second recess 24 has a concave top surface C. The spin-on dielectric layer 40 is made of a polymer compound containing nitrogen, hydrogen, and silicon. For example, the spin-on dielectric layer 40 used in this embodiment is made of perhydro polysilazane (PHPS), which is a material that is already used in the actual process, and is characterized in that the material is flowable, so it has better gap fill capability, and after the material is heated by steam or ultraviolet light, the internal nitrogen atoms will be removed and also reacted with oxygen atoms in the air, to be converted into insulated silicon layer (such as silicon oxide layer). It should be noted that although perhydro polyazane is exemplified in the present embodiment, the present invention is not limited thereto, and other materials having similar functions (having fluidity and being converted into a silicon oxide layer by vapor heating or ultraviolet light irradiation) can also be used, it should also be within the scope of the present invention.

Figure 4:
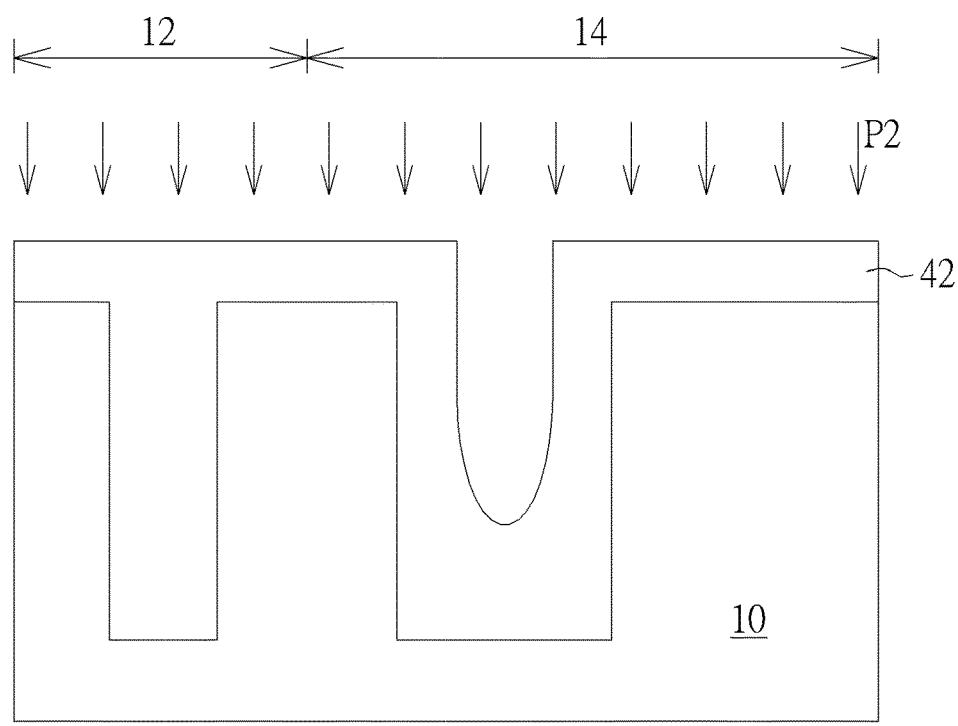

As shown in FIG. 4, a first processing step P2 is performed to convert the spin-on dielectric layer 40 filled in the first recess 22 and the second recess 24 into a first silicon oxide layer 42. In this embodiment, the first processing step P2 is, for example, steam of 150° C. to 700° C., heat treatment or ultraviolet light irradiation treatment in an oxygen-containing environment, the oxygen-containing environment contains steam, oxygen or ozone. As described above, the spin-on dielectric layer 40 contains atoms such as nitrogen, hydrogen, and silicon, and will be reacted with oxygen atoms in the air during conversion to a silicon oxide layer (silicon oxide), and the silicon atoms in the spin-on dielectric layer 40 itself will also be consumed. However, when the spin-on dielectric layer 40 has insufficient silicon atoms, it may consume silicon atoms of adjacent elements and continue to convert to silicon oxide. It is noted that an amorphous silicon layer 36 is formed between the spin-on dielectric layer 40 and the substrate 10. The amorphous silicon layer 36 can serve to protect the substrate 10, that is, to provide the silicon atoms to the conversion step of the spin-on dielectric layer 40, and to prevent the spin-on dielectric layer 40 from being excessively converted into silicon oxide by consuming silicon atoms in the substrate 10, thereby forming unnecessary silicon oxide in the substrate 10, especially in the cell region 12. In the present embodiment, the amorphous silicon layer 36 is simultaneously converted into a silicon oxide layer during the first processing step P2, therefore, the amorphous silicon layer 36 is not shown in FIG. 4. However, in other embodiments of the invention, the amorphous silicon layer 36 may not be completely consumed while still disposed on the substrate 10, and such embodiments are also within the scope of the present invention.

Figure 5:
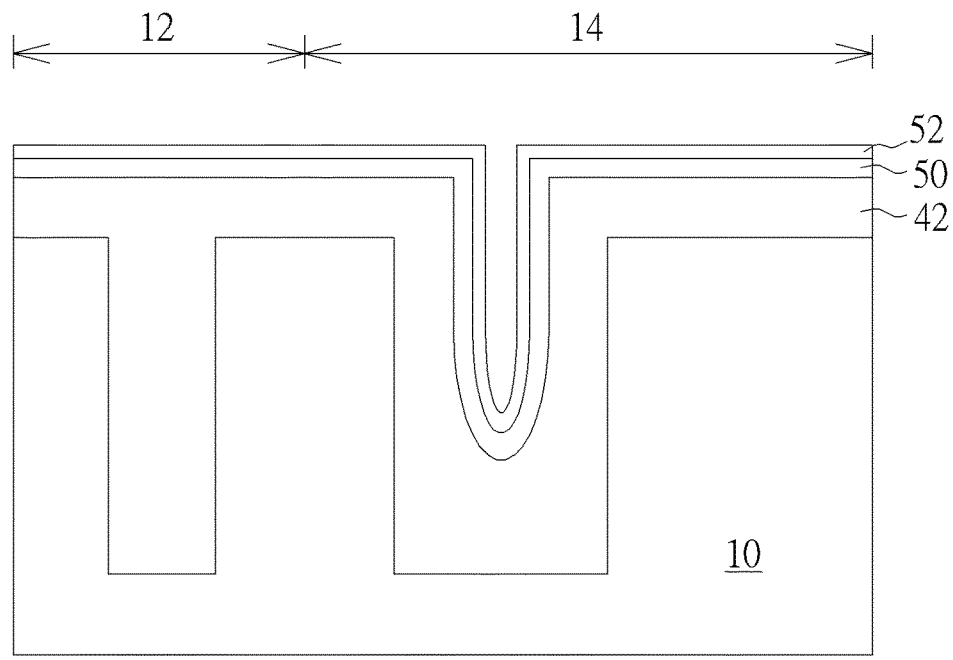

As shown in FIG. 5, a silicon nitride layer 50 and a silicon oxide layer 52 are formed on the first silicon oxide layer 42. Since the first recess 22 has been filled with the first silicon oxide layer 42, the silicon nitride layer 50 and the silicon oxide layer 52 are not located in the first recess 22, but are partially located in the second recess 24. It should be noted that the first silicon oxide layer 42 is converted by the spin-on dielectric layer 40 (for example, PHPS) after the first processing step P2, and the silicon oxide layer 52 is formed by different methods, for example, produced by physical vapor deposition, chemical vapor deposition, atomic layer deposition, and the like. Since it is necessary to form another spin-on dielectric layer (not shown) to fill the second recess 24 in the following steps, the applicant found that compared with forming the spin-on dielectric layer on the silicon nitride layer 50 directly, the silicon oxide layer 52 formed by deposition method has higher density, and therefore the subsequent spin-on dielectric layer which is formed on the silicon oxide layer 52 has better adhesion. In other words, the spin-on dielectric layer formed in the following steps can be better formed on the silicon oxide layer 52.

Figure 6:
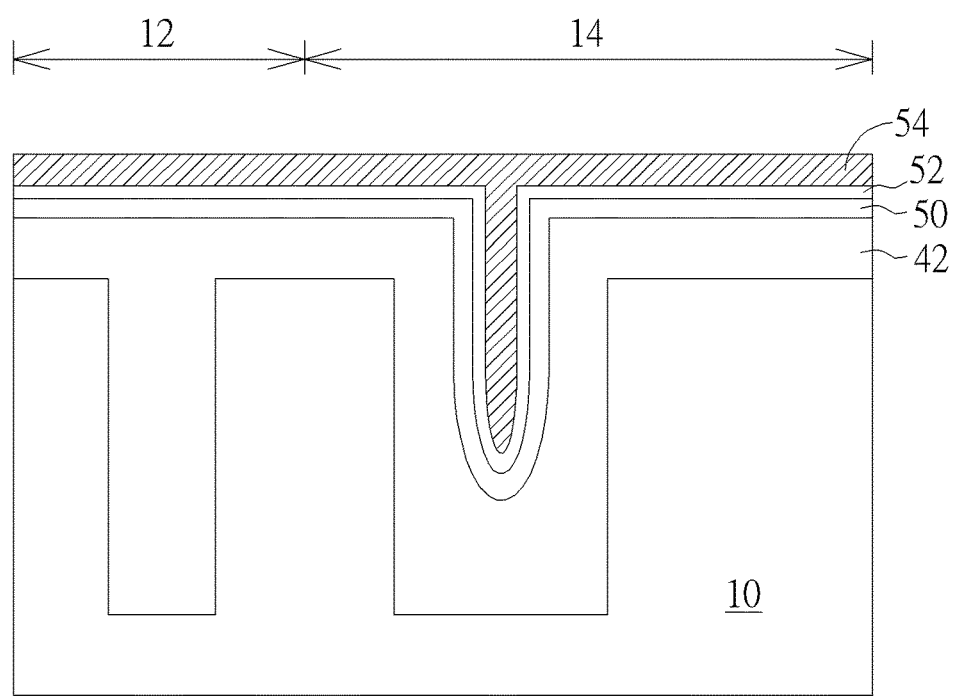
Figure 7:
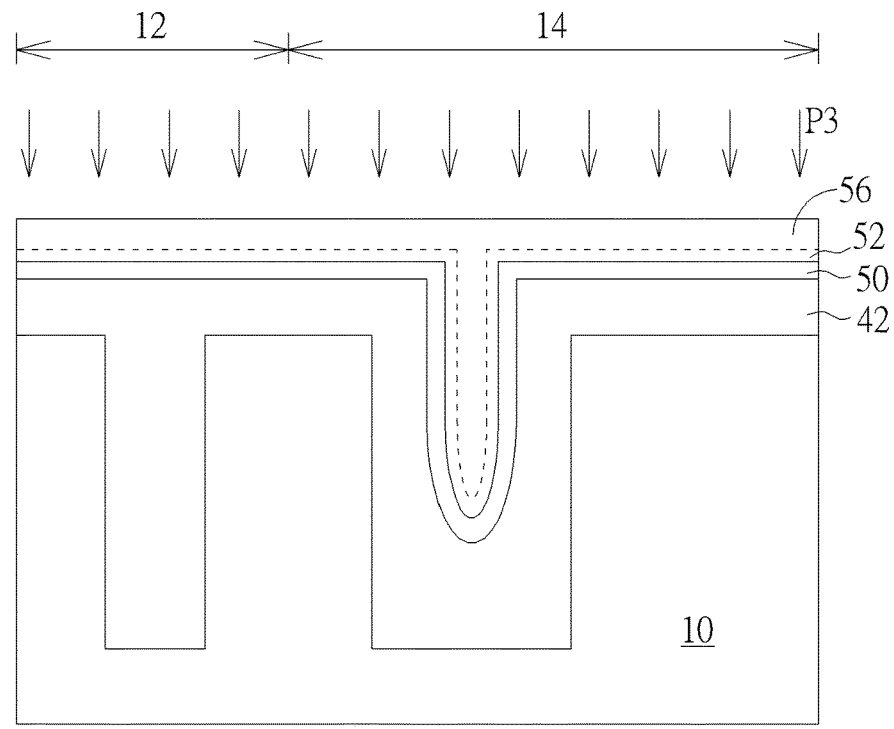

In addition, since some material layers such as the first silicon oxide layer 42 and the silicon nitride layer 50 have been formed in the second recess 24, the width of the second recess 24 has been reduced at this time. In this embodiment, at this step, the width of the second recess 24 is between 25 and 450 nm, but is not limited thereto. The remaining space of the second recess 24 has high aspect ratio. In order to avoid voids in the second recess 24 when the other material layers are subsequently filled, the present invention fills the second recess 24 with another spin-on dielectric layer. As shown in FIG. 6 and FIG. 7, a spin-on dielectric layer 54 is formed on the silicon oxide layer 52 and fills the second recess 24, the spin-on dielectric layer 54 is preferably made of the same material with that of the spin-on dielectric layer 40, such as perhydro polysilazane (PHPS) or other materials having similar properties. Next, as shown in FIG. 7, a second processing step P3 is performed to convert the spin-on dielectric layer 54 into a second silicon oxide layer 56. The second processing step P3 is the same as or similar to the first processing step P2, for example, including steam, heating or ultraviolet light irradiation in an oxygen-containing environment, and the like.

Figure 8:
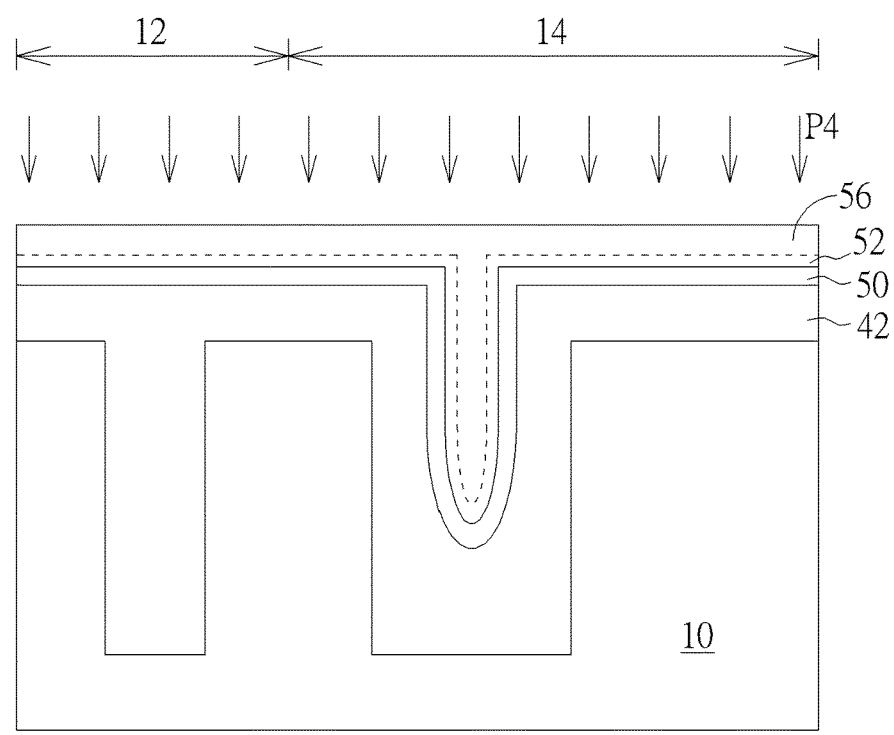

Finally, as shown in FIG. 8, a third processing step P4 is performed, such as a rapid thermal processing (RTP), and the temperature is preferably between 800° C. and 1100° C. Performing the third processing step P4 may further densify the first silicon oxide layer 42 and the second silicon oxide layer 56 (in other words, increase the density of the first silicon oxide layer 42 and the second silicon oxide layer 56), and also improve the quality of the overall semiconductor device. In the following steps, other semiconductor components, such as transistors, bit lines, resistive structures or capacitor structures, can be continuously formed. These semiconductor components are known in the art and will not be described here.

In summary, the invention is characterized in that since the different sizes shallow trench isolations needs to be formed in the cell region and the peripheral region, the silicon oxide layer is formed by deposition or the like, and the void is easily formed in the high aspect ratio recess. In order to avoid the above issue, the present invention fills a fluid material (for example, perhydro polysilazane, PHPS) in the high aspect ratio recess to replace forming the silicon oxide layer by deposition method, and then converting the fluid material into an insulating oxidation layer (such as silicon oxide layer) by steam heating or the like. Thus, the recesses can be effectively filled to avoid voids and further improve the quality of the overall semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
   providing a substrate;
   forming a first recess and a second recess in the substrate, wherein a width of the first recess is smaller than a width of the second recess;
   forming a first spin-on dielectric (SOD) layer, to fill the first recess and partially fill in the second recess;
   performing a first processing step, to transfer the first SOD layer into a first silicon oxide layer;
   forming a silicon nitride layer on the first silicon oxide layer in the second recess;
   forming a second spin-on dielectric (SOD) layer on the silicon nitride layer in the second recess; and
   performing a second processing step to transfer the second SOD layer into a second silicon oxide layer.

2. The method of claim 1, wherein the temperature of the first processing step and the second processing step is between 150° C. and 700° C.

3. The method of claim 1, wherein the first processing step and the second processing step comprise heat treatment or ultraviolet light irradiation treatment in an oxygen-containing environment.

4. The method of claim 3, wherein the oxygen-containing environment comprises steam, oxygen or ozone.

5. The method of claim 1, further comprising performing a third processing step, the temperature of the third process step is between 800° C. and 1100° C. to further densify the first silicon oxide layer and the second silicon oxide layer.

6. The method of claim 1, wherein the material of the first SOD layer and the material of the second SOD layer comprise perhydro polysilazane (PHPS).

7. The method of claim 1, further comprising forming an amorphous silicon layer in the first recess and the second recess, and between the first silicon oxide layer and the substrate.

8. The method of claim 7, wherein the amorphous silicon layer has a thickness of between 20 and 100 angstroms.

9. The method of claim 7, wherein further comprising forming a third silicon oxide layer in the first recess and the second recess, and the third silicon oxide layer is disposed between the amorphous silicon layer and the substrate.

10. The method of claim 9, further comprising performing an in situ steam generated (ISSG) step, and the third silicon oxide layer is produced by the ISSG step.

11. The method of claim 1, further comprising forming a fourth silicon oxide layer in the second recess, and disposed between the silicon nitride layer and the second silicon oxide layer.

12. The method of claim 1, wherein the first silicon oxide layer in the second recess does not fill the second recess, and the first silicon oxide layer has a concave top surface.

13. The method of claim 1, wherein the first recess is located in a cell region of a dynamic random access memory (DRAM) element, and the second recess is located in a peripheral region of the DRAM element.

14. The method of claim 1, wherein the width of the first recess is between 15 nm and 55 nm.

15. The method of claim 1, wherein the width of the second recess is between 75 nm and 500 nm.

* * * * *